(12) United States Patent
Arndt et al.

(10) Patent No.: US 8,378,366 B2
(45) Date of Patent: Feb. 19, 2013

(54) ELECTROMAGNETIC RADIATION EMITTING OPTOELECTRONIC COMPONENT AND METHOD FOR MANUFACTURING AN OPTOELECTRONIC COMPONENT

(75) Inventors: Karlheinz Arndt, Bad Abbach (DE); Kirstin Petersen, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/594,185

(22) PCT Filed: Mar. 26, 2008

(86) PCT No.: PCT/DE2008/000507
§ 371 (c)(1),
(2), (4) Date: Mar. 22, 2010

(87) PCT Pub. No.: WO2008/119327
PCT Pub. Date: Oct. 9, 2008

(65) Prior Publication Data
US 2010/0230694 A1    Sep. 16, 2010

(30) Foreign Application Priority Data
Mar. 30, 2007   (DE) .......................... 10 2007 015 474

(51) Int. Cl.
*H01L 33/00* (2010.01)
*H01L 29/18* (2006.01)
*H01L 21/00* (2006.01)

(52) U.S. Cl. .............. 257/98; 257/88; 257/99; 257/100; 257/E33.058; 257/E33.059; 257/E33.068; 438/27; 438/28; 438/29

(58) Field of Classification Search ........................ None
See application file for complete search history.

(56) References Cited

U.S. PATENT DOCUMENTS

| 5,040,868 | A | | 8/1991 | Waitl et al. | |
|---|---|---|---|---|---|
| 5,137,844 | A | * | 8/1992 | Chiulli | 427/554 |
| 5,684,309 | A | | 11/1997 | McIntosh et al. | |
| 5,831,277 | A | | 11/1998 | Raseghi | |

(Continued)

FOREIGN PATENT DOCUMENTS

| DE | 100 36 940 A1 | 2/2002 |
|---|---|---|
| DE | 101 47 040 | 4/2003 |

(Continued)

OTHER PUBLICATIONS

McNeil et al. Multiple Scattering From Tuile TiO2 Particles. Acta Mater. 48 (2000) pp. 4571-4576.*

(Continued)

*Primary Examiner* — Hoang-Quan Ho
(74) *Attorney, Agent, or Firm* — Cozen O'Connor

(57) ABSTRACT

An optoelectronic component is specified that emits a useful radiation. It comprises a housing having a housing base body with a housing cavity, and a light-emitting diode chip arranged in the housing cavity. At least one base body material of the housing base body has radiation-absorbing particles admixed in a targeted manner to reduce its reflectivity. According to another embodiment of the component, the housing additionally or alternatively has a housing material transmissive for the useful radiation that has radiation-absorbing particles admixed in a targeted manner to reduce its reflectivity. In addition, a method for manufacturing such a component is specified.

25 Claims, 3 Drawing Sheets

U.S. PATENT DOCUMENTS

| | | |
|---|---|---|
| 6,172,382 B1 | 1/2001 | Nagahama et al. |
| 6,613,247 B1 | 9/2003 | Hohn et al. |
| 6,616,862 B2 | 9/2003 | Srivastava et al. |
| 6,623,662 B2 * | 9/2003 | Wang et al. ............ 252/502 |
| 6,657,382 B2 * | 12/2003 | Nagai et al. ............ 313/512 |
| 6,670,748 B2 | 12/2003 | Ellens et al. |
| 6,800,996 B2 * | 10/2004 | Nagai et al. ............ 313/512 |
| 6,849,881 B1 | 2/2005 | Harle |
| 7,064,480 B2 | 6/2006 | Boker et al. |
| 7,263,294 B2 * | 8/2007 | Horio ..................... 398/128 |
| 7,501,660 B2 * | 3/2009 | Schmid et al. ............ 257/81 |
| 8,026,526 B2 * | 9/2011 | Weber-Rabsilber et al. ... 257/95 |
| 2002/0132454 A1 | 9/2002 | Ohtsu et al. |
| 2002/0192477 A1 | 12/2002 | Honda et al. |
| 2003/0168720 A1 | 9/2003 | Kamada |
| 2004/0061433 A1 | 4/2004 | Izuno et al. |
| 2004/0062699 A1 | 4/2004 | Oshio |
| 2004/0094757 A1 * | 5/2004 | Braune et al. ............ 257/13 |
| 2005/0006794 A1 | 1/2005 | Kashiwagi et al. |
| 2005/0129957 A1 | 6/2005 | Kashiwagi et al. |
| 2005/0282975 A1 | 12/2005 | Haitko et al. |
| 2006/0014429 A1 * | 1/2006 | Schmid et al. ............ 439/596 |
| 2007/0004065 A1 * | 1/2007 | Schardt et al. ............ 438/26 |
| 2007/0018102 A1 | 1/2007 | Braune et al. |
| 2007/0259206 A1 | 11/2007 | Oshio |
| 2008/0128718 A1 | 6/2008 | Sumitani |
| 2009/0173957 A1 | 7/2009 | Brunner et al. |
| 2009/0261365 A1 * | 10/2009 | Brunner et al. ............ 257/98 |

FOREIGN PATENT DOCUMENTS

| | | |
|---|---|---|
| DE | 103 61 661 | 3/2005 |
| DE | 10 2005 061 828 | 1/2007 |
| DE | 10 2005 041 064 | 3/2007 |
| DE | 10 2006 004 397 | 4/2007 |
| EP | 1 193 772 | 9/2001 |
| EP | 1 174 931 | 1/2002 |
| EP | 1 174 931 A2 | 1/2002 |
| EP | 1 408 559 | 10/2003 |
| JP | 63-159859 | 10/1988 |
| JP | 60-91934 | 4/1994 |
| JP | 11-119228 | 4/1999 |
| JP | 2003-017755 | 1/2003 |
| JP | 2003-46140 | 2/2003 |
| JP | 2003-335073 | 11/2003 |
| JP | 2008-160091 | 7/2008 |
| WO | WO 00/33390 | 6/2000 |
| WO | WO 01/39282 | 3/2001 |
| WO | WO 2005/008789 | 1/2005 |
| WO | WO 2007/036206 | 4/2007 |
| WO | WO2007036206 A1 * | 4/2007 |

OTHER PUBLICATIONS

Ahmed et al. Effect of multiple light scattering and self-absorption on the fluorescence and excitation spectra of dyes in random media. May 1, 1994. Applied Optics. vol. 33, No. 13. pp. 2746-2750.*

Danker Stefan: "Einsatz der Laserinduzierten Glatechnik zur Charakterisierung von Nanopartikeln unter produktionsnahen Bedingungen", Dissertation, Erlangen 2004, p. 38.

Pawlyta Mirka: "Mass Fractal Dimension of Soot Aggregates" University of Silesia, Faculty of Earth Sciences (2 pages), http://www.wnoz.us.edu.pl/mpbs.

Technische Information: "Wärmeleitfähigkeit und IR-optische Eigenschaften von Pigmentrußen", Carbon TI 1229, degussa.

* cited by examiner

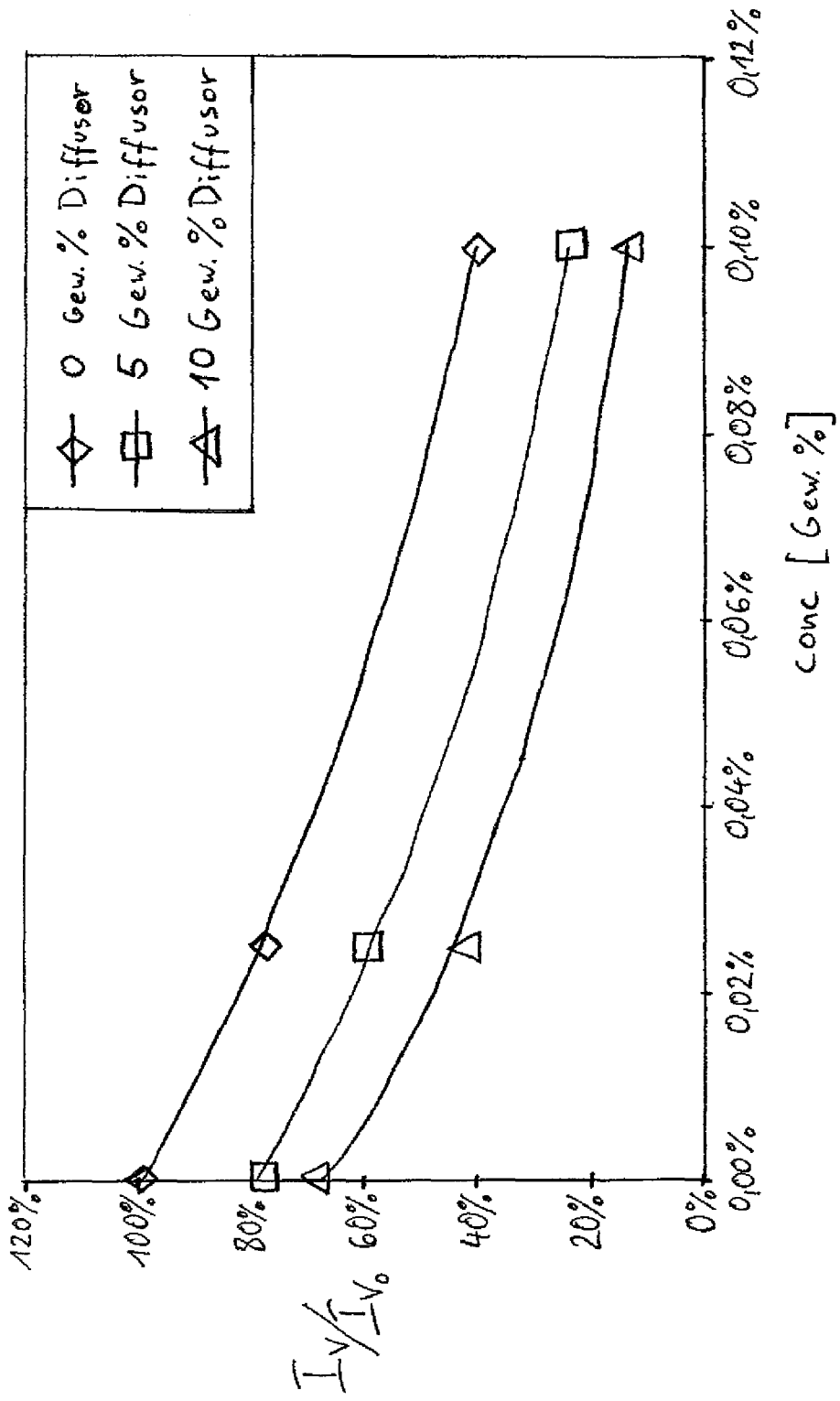

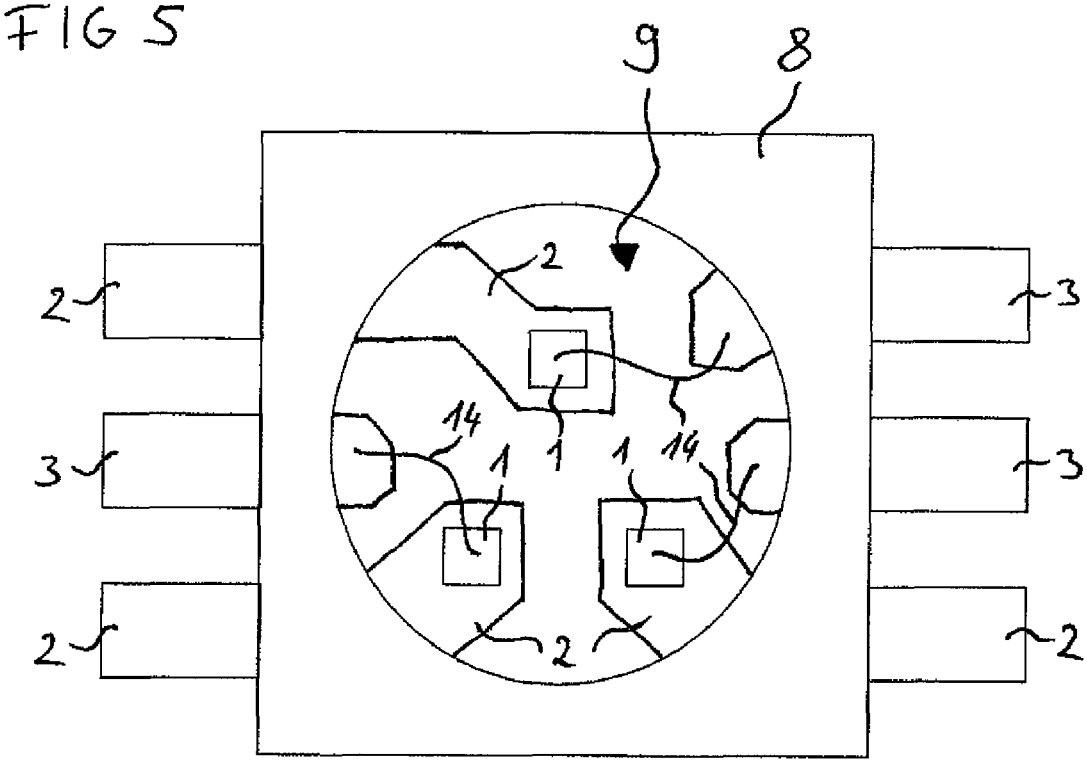

ELECTROMAGNETIC RADIATION EMITTING OPTOELECTRONIC COMPONENT AND METHOD FOR MANUFACTURING AN OPTOELECTRONIC COMPONENT

RELATED APPLICATIONS

This is a U.S. national stage of application No. PCT/DE2008/000507, filed on Mar. 26, 2008.

FIELD OF THE INVENTION

The present invention relates to an electromagnetic radiation emitting optoelectronic component, and to a method for manufacturing such a component.

BACKGROUND OF THE INVENTION

A light-emitting optoelectronic component is disclosed in U.S. Pat. No. 5,040,868. It has a housing base body with a sheath that encases two electrical conductor traces of a lead frame, as well as having a recess in which a light-emitting diode chip emitting an electromagnetic radiation is mounted electroconductively and mechanically. The recess is potted with a radiation-transmissive molding compound, by means of which an outcoupling from the light-emitting diode chip is improved and the light-emitting diode chip is protected from external influences. According to one disclosed embodiment, the sheath of the housing base body is formed from highly reflective plastic.

SUMMARY OF THE INVENTION

One object of the present invention is to provide an alternatively constructed optoelectronic component of the type mentioned above that has advantages over conventional components for special applications. In addition, a method for manufacturing such an optoelectronic component will be specified.

An optoelectronic component is disclosed that emits a useful radiation. It comprises a housing having a housing base body with a housing cavity, and a light-emitting diode chip arranged in the housing cavity. At least one base body material of the housing base body has radiation-absorbing particles admixed in a targeted manner to reduce its reflectivity.

In some applications, reflections of extraneous light on a housing of an optoelectronic component can be disruptive. The intensity of such reflections can be significantly reduced by admixture of radiation-absorbing particles into the base body material. A particularly good absorbing effect can be obtained by virtue of the fact that the radiation-absorbing particles are introduced into the base body material.

In principle, for example, a better effect can be achieved than for a radiation-transmissive and/or strongly reflective housing base body that is merely furnished on its exterior surface with a radiation-absorbing layer, such as a black paint layer. In particular, it is possible to forgo such a radiation-absorbing layer applied to the base body. Alternatively, however, it is also possible to additionally furnish the base body with a radiation-absorbing layer, at least on parts of the exterior surface of the component.

According to another embodiment of the component, the housing additionally or alternatively comprises a housing material transmissive for the useful radiation that has absorbing particles admixed in a targeted manner to reduce its reflectivity. In the case where both the housing material and the base body material have added radiation-absorbing particles, identical or different radiation-absorbing particles can be equally well used for these materials.

The term "radiation-absorbing particles" is understood in the context of the present application not to mean phosphors, which are absorptive for the radiation of a first wavelength band emitted by the light-emitting diode chip and are excited by this radiation to emit an electromagnetic radiation of a second wavelength range that differs from the first wavelength range. In other words, the radiation-absorbing particles do not reemit any optical radiation when they absorb useful electromagnetic radiation of the component. It is also possible that the radiation-absorbing particles not only absorb the useful radiation but also scatter it to some extent.

In one embodiment, for the case where radiation-absorbing particles are contained in both the housing material and the base body material, the concentration of the radiation-absorbing particles in the base body material is higher than in the radiation-transmissive housing material. In one configuration, the concentration is at least twice as high, and according to another configuration, at least five times as high in the base body material as in the housing material.

According to another embodiment, at least one additional light-emitting diode chip, or at least two additional light-emitting diode chips, is/are arranged in the housing cavity. The light-emitting diode chips arranged in the housing cavity can be chips of the same type, which all emit electromagnetic radiation of substantially the same wavelength spectrum. Alternatively, at least one of the light-emitting diode chips is of a different type, and in operation emits electromagnetic radiation of a wavelength spectrum that is different from the emission spectrum of the other light-emitting diode chips. It is also possible for all the light-emitting diode chips to have emission spectra differing from one another. In one configuration of the component, all the light-emitting diode chips emit electromagnetic radiation in operation that is visible, at least in part, to the human eye.

In a component according to an additional embodiment, scattering particles for scattering the useful radiation are arranged in the housing cavity. Additionally or alternatively, scattering particles for scattering the useful radiation are contained in the housing material that is transmissive for the useful radiation. In expert circles, scattering particles are also called diffuser particles. A more homogeneous emission characteristic for the optoelectronic component can be realized with such scattering particles. In particular, it is possible by means of the scattering particles to achieve the effect that the optoelectronic component has a greater effective emission area compared to a component without scattering particles.

By combining scattering particles and radiation-absorbing particles, it is possible on the one hand to reduce the reflectivity with respect to external extraneous light, and on the other hand to realize an emission characteristic for useful radiation that is advantageous for some applications. The scattering particles and the radiation-absorbing particles cooperate in such a combination.

According to another configuration of the component, the radiation-absorbing particles of the base body material are absorptive for a part or for the entirety of the wavelength spectrum of the useful radiation. In one embodiment, the wavelength spectrum of the useful radiation comprises a range visible to the human eye. Additionally or alternatively, the radiation-absorbing particles of the base body material are absorptive for a part or for the entirety of the wavelength spectrum of the radiation emitted in operation by the light-emitting diode chip or light-emitting diode chips.

According to an additional embodiment, the radiation-absorbing particles of the housing material are also absorptive for a part of or for the entirety of the range of the wavelength spectrum of the useful radiation and/or of the light-emitting diode chip.

In one configuration of the component, the absorption coefficient of the radiation-absorbing particles of the base body material and/or the housing material varies by less than 10% over the entire spectrum of the useful radiation. In particular, the particles have a negligibly low wavelength-dependence of absorption in the relevant wavelength range.

In an additional embodiment, the radiation-absorbing particles of the housing material and/or the base body material comprise carbon black. Carbon black is generally known as a by-product of combustion processes. In addition, it is industrially produced and used a colorant, particularly as a reinforcing filler in automobile tires. In general, carbon black has a relatively strong wavelength dependence of its absorption behavior, which also applies to visible light in particular. It was found, however, that certain forms of carbon black have a very low wavelength-dependence of their absorption behavior in the visible wavelength range.

Industrial carbon black is produced with various defined technical properties. Carbon black exists in the form of aggregates that are composed of a number of primary particles. Carbon black with especially small primary particle sizes is particularly suitable for use as radiation-absorbing particles. It can additionally be advantageous to use industrial carbon black with a compact aggregate structure. Among those specialized in the art, the English expression "low structure carbon black" (LSCB) is used. In one configuration of the component, the aggregates have an average extent of less than or equal to 1 µm.

The radiation-absorbing particles of the housing material and/or the base body material are electrically insulating in an additional embodiment of the component. Thus it is possible for the housing material transmissive to the useful radiation to be immediately adjacent to the light-emitting diode chip, without the danger of short circuit formation due to electrically conductive particles. Alternatively, electrically conductive particles can also be used. If the concentration of the latter in the housing material is sufficiently low, the risk of short-circuiting can likewise be at least largely avoided. The maximum concentration depends on the aggregate size. With LSCB, which has a small aggregate size compared to ordinary carbon black particles, a higher concentration can be used with the same risk of creating a short circuit.

In general, the radiation-absorbing particles of the housing material and/or the base body material have a mean particle diameter (particle mean) of less than or equal to 100 nm. Such small particles can be particularly well dispersed in a housing material. In the case of carbon black, the primary particles of the agglomerates in one configuration of the component have a small mean particle diameter of this type.

According to an additional embodiment, the housing material transmissive to the useful radiation and/or the base body material comprises a potting compound or a molding compound. With such materials, housing parts of well-defined shapes and dimensions can be produced. Potting compounds can be cast or formed in an injection molding process. Molding compounds can be worked in a transfer molding process.

In one expedient embodiment, the housing material transmissive for the useful radiation comprises at least one of the materials from the group consisting of epoxy resin, acrylate, silicon, thermoplastic, and hybrid material with at least one of these materials. In principle, a different hybrid material can also be used, i.e., a hybrid material that does not contain any of the materials epoxy resin, acrylate, silicone or thermoplastic.

In another embodiment, the light-emitting diode chip is encapsulated or encased by means of the housing material transmissive for the useful radiation. In particular, it is possible for the housing material to immediately adjoin the light-emitting diode chip.

In one configuration of the component, the housing cavity is at least partially filled with the housing material transmissive for the useful radiation. The housing cavity is preferably filled by potting with the compound that is transmissive for the useful radiation.

An additional embodiment of the component provides that the component comprises a housing body with an exterior surface. The housing material transmissive for the useful radiation is applied to at least the exterior surface of the housing body.

The housing material applied to the exterior surface of the housing body can expediently be in the form of a film. The latter is affixed to the exterior surface of the housing body by lamination or by means of an adhesive. The film advantageously has a constant thickness. It is expediently constructed flexibly. It is alternatively possible for the thickness of the film to vary. This can be accomplished, for example, by structuring a film of constant thickness.

Additionally or alternatively, it is also possible to use a film with admixed radiation-absorbing particles as housing material.

A method for manufacturing an optoelectronic element emitting a useful radiation is disclosed. Therein a housing base body is provided or manufactured with a cavity and with a base body material, wherein radiation-absorbing particles are mixed in a deliberate manner with the base body material. Furthermore, a light-emitting diode chip is provided. The light-emitting diode chip is mounted in the housing cavity.

In one embodiment of the method, material transmissive for the useful radiation is provided, wherein radiation-absorbing particles are mixed with the material in a targeted manner Subsequently, the material transmissive for the useful radiation is arranged in a beam path of the electromagnetic radiation that is to be emitted by the light-emitting diode chip in operation.

According to another embodiment, at least a part of the material transmissive for the useful radiation is arranged in the housing cavity. According to one configuration, the light-emitting diode chip is encapsulated or encased by the material transmissive for the useful radiation.

Another embodiment of the method provides the furnishing of a component, wherein the component contains the light-emitting diode chip and the housing base body. At least a part of the compound that is transmissive for the useful radiation is applied to an exterior surface of the housing body.

According to another embodiment, at least a part of the material transmissive for the useful radiation is provided in the form of a prefabricated material layer before application to the exterior surface of the housing body. Additionally or alternatively, it is provided that at least a part of the material transmissive for the useful radiation is provided in the form of a film before application to the exterior surface of the housing.

BRIEF DESCRIPTION OF THE DRAWINGS

FIG. 4 shows diagram in which a relative radiation intensity of various optoelectronic components is plotted as a function of the concentration of radiation-absorbing particles in the radiation-transmissive housing material, and FIG. 5 shows a schematic plan view of a fourth exemplary embodiment of the optoelectronic component.

DETAILED DESCRIPTION OF THE DRAWINGS

In the exemplary embodiments and figures, components that are the same or that have the same function are provided with the same reference numbers. The illustrated components and the size ratios of the components with respect to one another are not necessarily drawn to scale. Rather, some details of the figures are exaggerated for better understanding.

Figure 1:
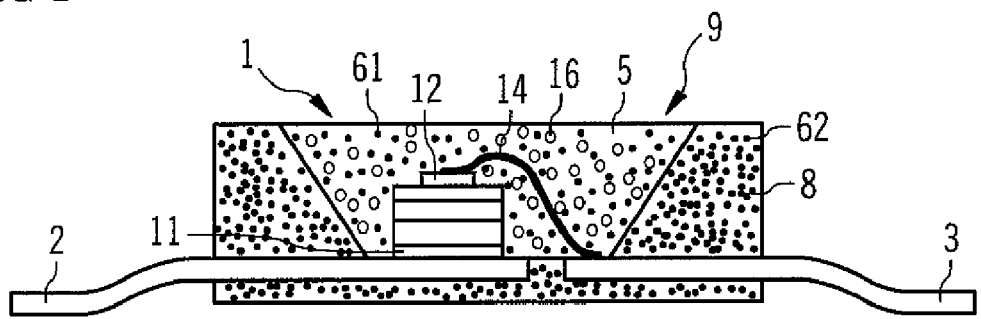
FIG. 1 shows a schematic sectional view of a first exemplary embodiment of the optoelectronic component.

In the optoelectronic component illustrated in FIG. 1, a light-emitting diode chip 1 is mounted by means of an electrically conductive connecting means, a metallic solder or an adhesive, for example, with a rear contact 11 on a first electrical terminal 2. On a side facing away from back-side contact 11, light-emitting diode chip 1 has a front contact 12 which is electroconductively connected by means of a bond wire 14 to a second electrical terminal 3 of the lead frame.

Exposed surfaces of light-emitting diode chip 1 and bond wire 14 are directly enclosed by a housing material 5 that is transmissive for an electromagnetic radiation emitted by light-emitting diode chip 1 in operation. This housing material 5 is, for example, a potting compound having more than 70 wt % epoxy molding resin. In addition, the potting compound can comprise additives such as diethylene glycol monomethyl ether, Tegopren 6875-45 and Aerosil 200.

Alternatively or additionally, housing material 5 comprises at least one hybrid material. With hybrid materials, it is possible to combine the positive properties of different materials with one another. For instance, disadvantageous properties of a material can be alleviated or eliminated. A polymer-hybrid material is used, for example. Hybrid materials that come into consideration are, e.g., silicone-modified epoxy resins, which age less strongly under the influence of ultraviolet light than conventional epoxy resins, but otherwise have essentially the same positive physical properties of conventional epoxy resins. It is also possible to mix at least one epoxy resin and at least one silicone with one another. Examples of such suitable hybrid materials are specified, for example, in US 2002/0192477 A1 or in US 2005/0129957 A1, the disclosures of which are hereby incorporated by reference.

It is additionally possible to combine silicone with acrylate, or silicone with acrylate and epoxy resin. It is naturally also possible not to use a hybrid material, and to use, for example, an acrylate, a silicone or a thermoplastic as a constituent of housing material 5.

For example, absorbing particles 61 are mixed into potting compound 5.

The exemplary embodiment of the optoelectronic component represented in FIG. 1 has a housing base body 8 with a recess 9. Light-emitting diode chip 1 is mounted in the recess on the first electrical terminal 2 of a lead frame. Recess 9 is filled with housing material 5, which is transmissive for a useful radiation emitted by the component.

Housing base body 8 is formed by means of injection molding, for example, which can be done before the mounting of light-emitting diode chip 1. The base body material comprises, for instance, polyphthalamide (PPA), which can be filled in one configuration with glass fibers and/or mineral substances. It has admixed radiation-absorbing particles 62.

The radiation-absorbing particles 61, 62 of radiation-transmissive housing material 5 and/or of the base body material of base body 8 are, for example, an industrially manufactured carbon black with defined technical properties. The carbon black particles are composed of a number of primary particles that together form an aggregate structure. This aggregate structure is preferably as compact as possible.

The primary particles of the carbon black particles have a mean diameter of less than or equal to 100 nm. For example, the mean diameter is 50 to 60 nm. The mean diameter is to be understood as the particle mean of the measured diameters. The aggregates have a mean diameter of less than or equal to 1 µm. A suitable industrial carbon black is the commercially available "Printex 25," which is manufactured by the Degussa company. This is a so-called "low structure carbon black" (LSCB) with a compact aggregate structure.

The particle size of the primary particles and the aggregates can be determined with different methods. Both parameters can be determined by means of a transmission electron microscope (TEM). The aggregate size can also be measured by means of scattered light intensity measurements. Differential mobility analyzers (DMA), which are usually used to determine the electrical mobility diameter of nanoscale aerosols, are also suitable for determining the primary particle size. Such measurement methods, as well as additional ones for determining the relevant particle diameter, are known to the person skilled in the art.

Unlike elongated aggregate structures, for example, compact aggregate structures have the advantage that they have less influence on the electrical conductivity of the material into which they are mixed. There are studies that show that LSCB particles cause a transition from a nonconductive to a conductive matrix material only at four times the volume concentration of so-called "high structure carbon black" (HSCB). For LSCB particles, for example, this transition begins above a volume concentration of ca. 40 vol %, whereas this can be the case for HSCB particles already at a concentration of 10 vol %. The presence of salts can shift this transition to lower concentrations.

Aggregates of carbon black can often be agglomerates that can have a size on the order of several microns or of several tens of µm. Such agglomerates should be avoided as much as possible. When carbon black particles are mixed into the uncured potting compound, they are worked in homogeneously with the aid of rotary blenders that are operated at very high speeds. High shearing forces occur during this working-in process that cause any agglomerates that may be present to be largely broken up.

The radiation-absorbing particles 61 are mixed into housing material 5 at a concentration of, for example, greater than 0.01 wt % up to and including 0.06 wt %. In particular, this concentration can be less than or equal to 0.04 wt %.

In the base body material of base body 8, the concentration of the radiation-absorbing particles 62 is greater, for example, than the concentration of the radiation-absorbing particles 61 in housing material 5. The concentration in the base body material lies between 0.1 wt %, inclusively, and 20 wt %, inclusively, preferably between 0.2 wt % and 10 wt %.

Additionally or alternatively to carbon black particles, the radiation-absorbing particles of housing material 5 and/or the base body can also comprise graphite particles, for example.

Scattering particles 16 are additionally mixed into housing material 5. The concentration of scattering particles 16 is maximally 10 wt %, for example. This concentration advantageously lies at a value between 0.1 wt % and 5 wt %, inclusive, in particular, between 0.75 wt % and 4 wt %. For instance, the concentration of the scattering particles may be roughly 1.25 wt % or 3 wt %.

The scattering particles comprise, for example, CaF and/or $TiO_2$ particles or consist of such particles. These are of course not the only possible particles for scattering particles. The expert in the field of optoelectronics or optics will find the scattering particles suitable for his purposes without any difficulty, the size and material composition of which scattering particles can depend, among other things, on the wavelength of the radiation to be scattered. The selection of the suitable diffuser particles will depend, in particular, on the wavelength of the electromagnetic radiation emitted by or to be received by light-emitting diode chip 1.

One advantage of such a use of scattering particles 16 is that they can act not only on the radiation emitted by the light-emitting diode chip, but also on the light incident from the exterior. In contrast to a clear potting compound without scattering particles 16, the external radiation is therefore not reflected back, but is instead radiated diffusely. Thus an improved contrast of the component can be achieved not only due to the light-absorbing particles, but additionally or alternatively by means of the scattering particles 16 of the component.

Due to a reduced reflectivity of the housing, for example, interfering reflection of sunlight on the component can be reduced.

The light-emitting diode chip comprises, e.g., a semiconductor layer sequence 7 that is based on nitride compound semiconductor materials. Nitride compound semiconductor materials are compound semiconductor materials that contain nitrogen, such as the materials from the $In_xAl_yGa_{1-x-y}N$ system with $0 \leq x \leq 1$, $0 \leq y \leq 1$ and $x+y<1$. The group of radiation-emitting light-emitting diode chips based on nitride compound semiconductor materials includes in the present case particularly those light-emitting diode chips in which semiconductor layer sequence 7 includes at least a single layer that comprises a material from the nitride compound semiconductor system.

Alternatively, semiconductor layer sequence 7 is based, for example, on phosphide compound semiconductor materials or on arsenide compound semiconductor materials. These include materials from the $In_xAl_yGa_{1-x-y}P$ system with $0 \leq x \leq 1$, $0 \leq y \leq 1$ and $x+y \leq 1$ or from the $In_xAl_yGa_{1-x-y}As$ system with $0 \leq x \leq 1$, $0 \leq y \leq 1$ and $x+y \leq 1$.

Semiconductor layer sequence 7 can have a conventional pn junction, a double heterostructure, a single quantum well structure (SQW structure) or a multiple quantum well structure (MQW structure). Such structures are known to those in the art and will therefore not be discussed in detail at this point.

The exemplary embodiments of the component illustrated in FIGS. 2 and 3 differ from the exemplary embodiment previously discussed with reference to FIG. 1 in that recess 9 of housing base body 8 is filled in each case with a filler material 15 that is free of radiation-absorbing particles. Recess 9, for example, is filled with filler material 15 in such a manner that light-emitting diode chip 1 mounted in recess 9 is encapsulated by housing material 15.

The inner filler material 15 consists, for example, of an epoxy, silicone or acrylate resin conventionally used in light-emitting diode technology, or of another suitable radiation-transmissive material such as inorganic glass. The filler material 15 contains, for example, scattering particles 16, cf. FIG. 2.

A housing material 5 with admixed radiation-absorbing particles 61 is applied on top of this filler material 15. Housing material 5 and the radiation-absorbing particles can be of the type discussed previously in connection with the exemplary embodiment illustrated in FIG. 1. The same applies to housing base body 8 and the radiation-absorbing particles 62 contained therein. Housing base body 8, for example, can also be free of radiation-absorbing particles 61 on a side of the electrical terminals facing away from light-emitting diode chip 1, cf. FIG. 2 or FIG. 3.

Figure 2:
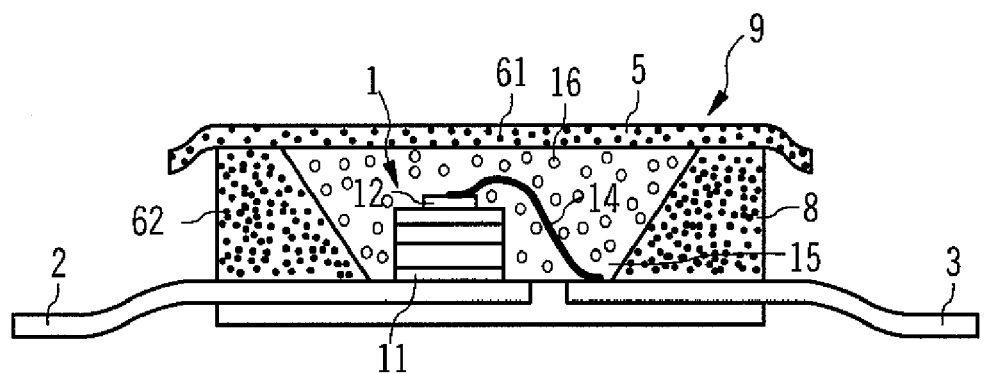
FIG. 2 shows a schematic sectional view of a second exemplary embodiment of the optoelectronic component.
Figure 3:
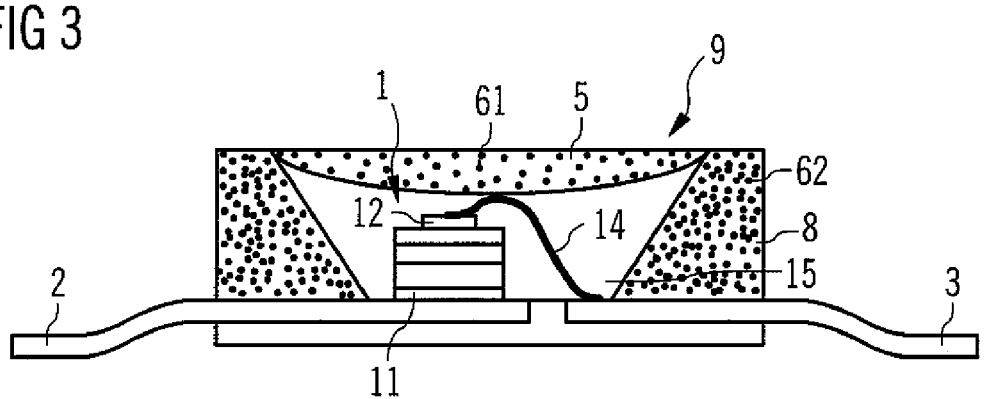
FIG. 3 shows schematic sectional view of a third exemplary embodiment of the optoelectronic component.

Alternatively to the exemplary embodiments represented in FIG. 2 or 3, radiation-absorbing particles 61 can also be mixed with a part of the housing immediately encapsulating light-emitting diode chip 1, on which in turn can be placed a transparent filler material that is free of radiation-absorbing particles.

For the components illustrated in FIGS. 2 and 3, housing base body 8 and filler material 15 form a housing body. The additional housing material 5 is applied to the exterior surface of this housing body.

For the component illustrated in FIG. 2, the housing material 5 containing the radiation-absorbing particles 61 is applied to the exterior surface of housing body 8, 15. In the manufacturing of the component, housing material 5 can be provided in the form of a prefabricated layer with, for example, constant thickness, before it is applied to the exterior surface of housing body 8, 15. The application is performed by means of gluing or laminating. In particular, it is possible to provide the layer-like housing material 5 as a film that is flexible and can therefore also be applied to uneven exterior surfaces of the housing body. After application, the film can be cured, for example, and lose its flexibility.

A housing body 8, 15 with an uneven exterior surface is represented as an example in FIG. 3. For example, a housing material 5 with radiation-absorbing particles 61 that is provided as a film can be applied there. This possibility is not shown in FIG. 3, however. In the illustrated exemplary embodiment, the recess 9 is only partially filled with housing material 15. The exterior surface of this housing material 15 has a concave curvature and thus forms a tub-like or basin-like depression. This depression is filled with housing material 5 having radiation-absorbing particles 61. The depression is filled, for example, by providing the housing material 5 in the form of an uncured compound, potting the depression formed by the exterior surface of filler material 15 with this compound, and by subsequent curing of the housing material 5.

In the component illustrated in FIG. 3, housing material 5 has a layer-like shape, but not one having a constant thickness. In the area of the optical axis of the component, for example, housing material 5 has its greatest thickness, which becomes increasingly smaller with increasing distance from the optical axis of the component. Not only the light intensity or radiation intensity emitted by the component, but also its emission characteristic can be adjusted by such housing material layers 5 of variable thickness. The variation of thickness of housing material 5 can in principle be of any desired type, and is matched to the component present in a specific case and to the emission characteristic to be obtained.

Alternatively to the example illustrated in FIG. 3, it is also possible for housing material 5 to have a greater thickness in the peripheral areas than in the center.

In all exemplary embodiments it is possible, in addition to or as an alternative to the use of a housing material with admixed radiation-absorbing particles 61, for the light-emitting diode chip to be provided with a film in which radiation-absorbing particles are admixed. The film comprises, for example, a silicone or a hybrid material with an epoxy resin. The radiation-absorbing particles can be constituted as already described.

The measurement results presented in FIG. 4 were obtained with optoelectronic components that were constructed as already described with reference to FIG. 1. The relative radiation intensity (relative brightness) $I_V/I_{VO}$ for various components was measured. The measurement results are plotted in FIG. 4 as a function of the concentration cone of the radiation-absorbing particles in housing material 5, with the concentration given in wt %.

Three measurement series were conducted, in each of which a substantially constant concentration of scattering particles 16 is contained in housing material 5. In a first measurement series, no scattering particles are contained in housing material 5. In a second measurement series, roughly 5 wt % scattering particles are contained in housing material 5, and in a third measurement series, roughly 10 wt % scattering particles are contained in housing material 5.

It can be recognized that the radiation intensity decreases with an increasing content of scattering particles and an identical content of radiation-absorbing particles. The radiation intensity likewise decreases with an increasing content of radiation-absorbing particles and an identical content of scattering particles.

At the cost of the emitted radiation intensity, a more homogeneous emission characteristic is achieved for the component due to the scattering particles, and due to the radiation-absorbing particles, a significantly lower reflectivity with respect to extraneous radiation from the outside. Such components can be used for applications in which the absolute radiation intensity is not what matters, but in which in particular a contrast in the perception of the component in operation, on the one hand, and not in operation, on the other, is of importance.

FIG. 5 represents a plan view of a component in which three light-emitting diode chips 1 are arranged in the recess 9. The housing accordingly has a total of six electrical terminals 2, 3, namely three first terminals 2 and three second terminals 3. By means of the scattering particles in the recess, it is possible to prevent the emission surface of the light-emitting diode chips 1 from being perceptible as such. The light-emitting diode chips can be constructed identically or differently from one another.

The description with reference to exemplary embodiments does not limit the invention thereto. Instead, the invention comprises every novel feature as well as every combination of features, which includes, in particular, every combination of features in the claims, even if this feature or this combination itself is not specified explicitly in the claims or exemplary embodiments. In addition to carbon black, there are a great number of other materials that are suitable for use as radiation-absorbing particles in the component.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An optoelectronic component that emits a useful radiation, with a housing, wherein the housing comprises a housing base body with a base body material and a housing cavity, and comprises a housing material transmissive for the useful radiation, and with a light-emitting diode chip arranged in the housing cavity, wherein radiation-absorbing particles are admixed in a targeted manner with the housing material as well as the base body material to reduce their reflectivity; and wherein a concentration of the radiation-absorbing particles in the base body material is higher than in the housing material transmissive for the useful radiation;
wherein at least one of the radiation-absorbing particles of the housing material and the base body material comprise carbon black;
wherein the carbon black is an industrial carbon black with compact aggregate structure (LSCB, "low structure carbon black").

2. The optoelectronic component according to claim 1, wherein at least one additional light-emitting diode chip is arranged in the housing cavity.

3. The optoelectronic component according to claim 1, wherein scattering particles for scattering the useful radiation are arranged in the housing cavity.

4. The optoelectronic component according to claim 1, wherein scattering particles for scattering the useful radiation are arranged in the housing material transmissive for the useful radiation.

5. The optoelectronic component according to claim 1, wherein at least one of the radiation-absorbing particles of the housing material and the base body material are absorptive for the entire wavelength spectrum of the useful radiation or for a part of this wavelength spectrum.

6. The optoelectronic component according to claim 1, wherein at least one of the radiation-absorbing particles of the housing material and the base body material are absorptive for the entire wavelength spectrum of the radiation emitted by the light-emitting diode chip in its operation, or for a part of this wavelength spectrum.

7. The optoelectronic component according to claim 1, wherein the housing material transmissive for the useful radiation and/or the base body material comprises a potting compound or a molding compound.

8. The optoelectronic component according to claim 1, wherein the housing material transmissive for the useful radiation comprises at least one of the materials from the group consisting of epoxy resin, acrylate, silicone, thermoplastic, and hybrid material with at least one of these materials.

9. The optoelectronic component according to claim 1, wherein at least one of the radiation-absorbing particles of the housing material and the base body material have an average particle diameter of less than or equal to 100 nm.

10. The optoelectronic component according to claim 1, wherein at least one of the absorption coefficient of the radiation-absorbing particles of the base body material and the housing material varies by less than 10% in the entire spectrum of the useful radiation.

11. The optoelectronic component according to claim 1, wherein the housing cavity is least partially filled with the housing material transmissive for the useful radiation.

12. The optoelectronic component according to claim 1, wherein the light-emitting diode chip is one of encapsulated and encased by the housing material transmissive for the useful radiation.

13. The optoelectronic component according to claim 1, wherein the housing material transmissive for the useful radiation is applied at least in part to an outer surface of the housing base body.

14. A method for manufacturing an optoelectronic element emitting a useful radiation, comprising the steps of:
fabricating or manufacturing a housing base body with a cavity and with a base body material into which radiation-absorbing particles are admixed in a targeted manner;

providing at least one light-emitting diode chip;

providing a material transmissive for the useful radiation, into which radiation-absorbing particles are admixed in a targeted manner;

mounting the light-emitting diode chip in the housing cavity; and arranging the material transmissive for the useful radiation in a beam path of the electromagnetic radiation that is to be emitted by the light-emitting diode chip in operation;

wherein a concentration of the radiation-absorbing particles in the base body material is higher than in the material transmissive for the useful radiation;

wherein at least one of the radiation-absorbing particles of the housing material and the base body material comprise carbon black; and wherein the carbon black is an industrial carbon black with a compact aggregate structure (LSCB, "low structure carbon black").

15. The method according to claim 14, wherein at least a part of the material transmissive for the useful radiation is arranged in the housing cavity.

16. The method according to claim 15, wherein the light-emitting diode chip is encapsulated or encased by the material transmissive for the useful radiation.

17. The method according to claim 14, wherein a component is provided that contains the light-emitting diode chip and the housing base body, and at least a part of the material transmissive for the useful radiation is applied to an exterior surface of the housing.

18. The method according to claim 17, wherein at least a part of the material transmissive for the useful radiation is provided in the form of a prefabricated material layer before application to the exterior surface.

19. An optoelectronic component that emits a useful radiation, with a housing, wherein the housing comprises:

a housing base body comprising a base body material;

a housing cavity in the housing base body;

a light-emitting diode chip arranged in the housing cavity; and a housing material transmissive for the useful radiation, at least a part of the housing material transmissive for the useful radiation being arranged in the housing cavity or being applied to an outer surface of the housing base body;

wherein radiation-absorbing particles are admixed in a targeted manner with the housing material and the base body material to reduce reflectivity of the housing material and the base body material;

wherein a concentration of the radiation-absorbing particles in the base body material is higher than in the housing material transmissive for the useful radiation;

wherein at least one of the radiation-absorbing particles of the housing material and the base body material carbon black; and wherein the carbon black is an industrial carbon black with a compact aggregate structure (LSCB, "low structure carbon black").

20. The optoelectronic component according to claim 1, wherein the concentration of the radiation-absorbing particles in the base body material is at least twice as high as in the housing material transmissive for the useful radiation.

21. The optoelectronic component according to claim 1, wherein the concentration of radiation-absorbing particles in the base body material is between 0.1 wt % and 20 wt %.

22. The optoelectronic component according to claim 1, wherein the concentration of the radiation-absorbing particles in the housing material transmissive for the useful radiation is between 0.01 wt % and 0.06 wt %.

23. The optoelectronic component according to claim 1, wherein the low structure carbon black comprises aggregates composed of a plurality of primary particles, the aggregates having an average extend of less than or equal to 1 µm, and the primary particles having an average diameter of less than or equal to 100 nm.

24. The method according to claim 14, wherein the low structure carbon black comprises aggregates composed of a plurality of primary particles, the aggregates having an average extend of less than or equal to 1 µm, and the primary particles having an average diameter of less than or equal to 100 nm.

25. The optoelectronic component according to claim 19, wherein the low structure carbon black comprises aggregates composed of a plurality of primary particles, the aggregates having an average extend of less than or equal to 1 µm, and the primary particles having an average diameter of less than or equal to 100 nm.

* * * * *

UNITED STATES PATENT AND TRADEMARK OFFICE
CERTIFICATE OF CORRECTION

PATENT NO. : 8,378,366 B2
APPLICATION NO. : 12/594185
DATED : February 19, 2013
INVENTOR(S) : Karlheinz Arndt et al.

Page 1 of 1

It is certified that error appears in the above-identified patent and that said Letters Patent is hereby corrected as shown below:

In the Claims:

Col. 12, claim 19, line 9, after "material" and before "carbon", insert --comprise--.

Signed and Sealed this
Sixteenth Day of July, 2013

Teresa Stanek Rea
*Acting Director of the United States Patent and Trademark Office*